United States Patent
Chiras et al.

(10) Patent No.: US 8,230,276 B2
(45) Date of Patent: Jul. 24, 2012

(54) WRITING TO MEMORY USING ADAPTIVE WRITE TECHNIQUES

(75) Inventors: Stefanie Chiras, Poughkeepsie, NY (US); Michele Franceschini, Yorktown Heights, NY (US); John P. Karidis, Yorktown Heights, NY (US); Luis A. Lastras, Yorktown Heights, NY (US); Mayank Sharma, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 474 days.

(21) Appl. No.: 12/568,035

(22) Filed: Sep. 28, 2009

(65) Prior Publication Data

US 2011/0078392 A1   Mar. 31, 2011

(51) Int. Cl.
*G11C 29/00* (2006.01)

(52) U.S. Cl. ........................................ 714/719; 714/764

(58) Field of Classification Search ............... 365/233.5, 365/45, 185.11; 711/155; 714/758, 719, 714/764
See application file for complete search history.

(56) References Cited

U.S. PATENT DOCUMENTS

| | | | |
|---|---|---|---|
| 5,243,575 A * | 9/1993 | Sambandan et al. ........ | 365/233.5 |
| 5,502,728 A | 3/1996 | Smith, III | |
| 5,623,436 A * | 4/1997 | Sowards et al. .................. | 365/45 |
| 5,751,993 A | 5/1998 | Ofek et al. | |
| 5,818,755 A * | 10/1998 | Koyanagi et al. ........ | 365/185.11 |
| 5,860,080 A | 1/1999 | James et al. | |
| 5,867,429 A | 2/1999 | Chen et al. | |
| 5,912,839 A | 6/1999 | Ovshinsky et al. | |
| 5,987,570 A | 11/1999 | Hayes et al. | |
| 6,009,547 A * | 12/1999 | Jaquette et al. ............... | 714/758 |
| 6,026,464 A | 2/2000 | Cohen | |
| 6,040,993 A | 3/2000 | Chen et al. | |
| 6,076,183 A | 6/2000 | Espie et al. | |

(Continued)

FOREIGN PATENT DOCUMENTS

WO   WO2006064497 A2   6/2006

OTHER PUBLICATIONS

Feng Qin et al.; "Exploiting ECC-Memory for Detecting Memory Leaks and Memory Corruption during Production Runs", 11th International Symposium on High-Performance Comptuer Architecture (HPCA-11-2005), pp. 12.

(Continued)

*Primary Examiner* — David Ton
(74) *Attorney, Agent, or Firm* — Cantor Colburn LLP; Brian Verminski (57) ABSTRACT

Techniques for writing to memory using adaptive write techniques. An adaptive write technique includes receiving at a computer a message including a plurality of symbols. The message is written to a memory. The writing to memory includes performing for each symbol in the message: writing a data value to a memory location in the memory and reading contents of the memory location after the data value has been written. The data value is determined at the computer in response to the symbol and to the contents of any memory locations previously read as part of writing the message to the memory. It is determined at the computer if the contents of the memory locations reflect the message. The writing is restarted at the computer in response to determining that the contents of the memory locations do not reflect the message.

20 Claims, 10 Drawing Sheets

U.S. PATENT DOCUMENTS

| | | | |
|---|---|---|---|
| 6,222,762 B1 | 4/2001 | Guterman et al. |
| 6,226,723 B1 | 5/2001 | Gustavson et al. |
| 6,292,398 B1 | 9/2001 | Pasotti et al. |
| 6,292,903 B1 | 9/2001 | Coteus et al. |
| 6,301,151 B1 | 10/2001 | Engh et al. |
| 6,397,366 B1 | 5/2002 | Tanaka et al. |
| 6,415,363 B1 | 7/2002 | Benayoun et al. |
| 6,424,566 B1 | 7/2002 | Parker |
| 6,457,174 B1 | 9/2002 | Kuroda et al. |
| 6,473,879 B1 | 10/2002 | Ishii et al. |
| 6,522,580 B2 | 2/2003 | Chen et al. |
| 6,570,784 B2 | 5/2003 | Lowrey |
| 6,728,826 B2 | 4/2004 | Kaki et al. |
| 6,748,561 B2 | 6/2004 | Prasad |
| 6,816,413 B2 | 11/2004 | Tanzawa |
| 6,870,773 B2 | 3/2005 | Noguchi et al. |
| 6,937,522 B2 | 8/2005 | Funaki |
| 6,970,382 B2 | 11/2005 | Toros et al. |
| 7,031,181 B1 | 4/2006 | Happ |
| 7,073,012 B2 | 7/2006 | Lee |
| 7,103,812 B1 | 9/2006 | Thompson et al. |
| 7,127,004 B1 | 10/2006 | Sonning et al. |
| 7,177,199 B2 | 2/2007 | Chen et al. |
| 7,180,771 B2 | 2/2007 | Cho et al. |
| 7,203,886 B2 | 4/2007 | Brown et al. |
| 7,292,466 B2 | 11/2007 | Nirschl |
| 7,301,817 B2 | 11/2007 | Li et al. |
| 7,305,596 B2 | 12/2007 | Noda et al. |
| 7,313,016 B2 | 12/2007 | Dodge et al. |
| 7,327,609 B2 | 2/2008 | Kim et al. |
| 7,352,624 B2 | 4/2008 | Roohparvar |
| 7,352,627 B2 | 4/2008 | Cohen |
| 7,355,237 B2 | 4/2008 | Lutze et al. |
| 7,362,615 B2 | 4/2008 | Pham et al. |
| 7,372,725 B2 | 5/2008 | Philipp et al. |
| 7,391,642 B2 | 6/2008 | Gordon et al. |
| 7,397,698 B2 | 7/2008 | Fong et al. |
| 7,430,639 B1 | 9/2008 | Bali et al. |
| 7,436,703 B2 | 10/2008 | Pham et al. |
| 7,440,315 B2 | 10/2008 | Lung |
| 7,447,948 B2 | 11/2008 | Galbi et al. |
| 7,471,559 B2 | 12/2008 | Shibata |
| 7,480,176 B2 | 1/2009 | Kamei |
| 7,542,336 B2 | 6/2009 | Han |
| 7,606,077 B2 | 10/2009 | Li et al. |
| 2002/0099996 A1 | 7/2002 | Demura et al. |
| 2003/0163776 A1 | 8/2003 | Prasad |
| 2005/0138276 A1 | 6/2005 | Navada et al. |
| 2005/0166006 A1 | 7/2005 | Talbot et al. |
| 2005/0190609 A1 | 9/2005 | Janssen et al. |
| 2005/0240745 A1 | 10/2005 | Lyer et al. |
| 2005/0251621 A1 | 11/2005 | Theis |
| 2006/0015780 A1 | 1/2006 | Fong |
| 2006/0090051 A1 | 4/2006 | Speier et al. |
| 2006/0155791 A1 | 7/2006 | Tene et al. |
| 2006/0179400 A1 | 8/2006 | Qian et al. |
| 2007/0153579 A1 | 7/2007 | Roohparvar et al. |
| 2007/0189065 A1 | 8/2007 | Suh et al. |
| 2008/0010581 A1 | 1/2008 | Alrod et al. |
| 2008/0025080 A1 | 1/2008 | Chan et al. |
| 2008/0034272 A1 | 2/2008 | Wu et al. |
| 2008/0052424 A1 | 2/2008 | Sameshima et al. |
| 2008/0114947 A1 | 5/2008 | Brox et al. |
| 2008/0151613 A1 | 6/2008 | Chao et al. |
| 2008/0162858 A1 | 7/2008 | Moyer |
| 2008/0222368 A1 | 9/2008 | Gehrmann |
| 2008/0222491 A1 | 9/2008 | Lee et al. |
| 2008/0266991 A1 | 10/2008 | Lee et al. |
| 2008/0282106 A1 | 11/2008 | Shalvi et al. |
| 2009/0003044 A1 | 1/2009 | Happ et al. |
| 2009/0034324 A1 | 2/2009 | Kim et al. |
| 2009/0157994 A1 | 6/2009 | Hampel et al. |
| 2010/0036997 A1 | 2/2010 | Brewer et al. |
| 2011/0145504 A1 | 6/2011 | Anh et al. |

OTHER PUBLICATIONS

G. Novark et al.; "Exterminator: Automatically Correcting Memory Errors with High Probability"; PLDI'07; Jun. 11-13, 2007; San Diego, CA; Copyright 2007; 11 pages.

Ki-Tae Park et al., "A Zeroing Cell-to-Cell Interference Page Architecture with Temporary LSB Storing and Parallel MSB Program Scheme for MLC NAND Flash Memories," IEEE Journal of Solid-State Circuits, vol. 43, No. 4, Apr. 2008, pp. 919-928.

Noboru Shibata et al., "A 70 nm 16 Gb 1-Level-Cell NAND Flash Memory", IEEEJournal of Solid-State Circuits, vol. 43, No. 4, Apr. 2008, pp. 929-937.

\* cited by examiner

Method 1:

Goal is to convey the message MY-MESSAGE

| Time | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| Write requests | M | Y | - | M | E | E | S | S | S | A | G | E | | |
| Actual contents | M | Y | - | M | T | E | S | N | S | A | G | E | | |

Errors → (

FIG. 10

WRITING TO MEMORY USING ADAPTIVE WRITE TECHNIQUES

BACKGROUND

This invention relates generally to computer memory, and more specifically, to writing to memory using adaptive write techniques.

Limited lifetime computer storage devices include, but are not limited to, flash memory (e.g., not-and or "NAND" flash memory, and not-or or "NOR" flash memory) and phase change memory (PCM). Limited lifetime memory technologies may benefit from iterative write techniques (commonly referred to as "write-and-verify") that are comprised of a sequence of write and read operations. Iterative write techniques may allow a controller for the memory to store a desired value with an increased accuracy, since the read operations offer a feedback mechanism that can be used to reduce errors in the writing process. Such increased accuracy is particularly relevant when the storage of more than one bit per cell is desired. A drawback of write-and-verify techniques is that the iterative process consumes additional resources in the memory. For example, the write bandwidth gets reduced in a manner proportional to the number of attempts it takes to store a value in the memory.

SUMMARY

An exemplary embodiment is a computer implemented method for writing to memory. The method includes receiving at a computer a message including a plurality of symbols. The message is written to a memory. The writing to memory includes performing for each symbol in the message: writing a data value to a memory location in the memory and reading contents of the memory location after the data value has been written. The data value is determined at the computer in response to the symbol and to the contents of any memory locations previously read as part of writing the message to the memory. It is determined at the computer if the contents of the memory locations reflect the message. The writing is restarted at the computer in response to determining that the contents of the memory locations do not reflect the message.

Another exemplary embodiment is a computer program product for writing to memory. The computer program product includes a tangible storage medium readable by a processing circuit and storing instructions for execution by the processing circuit for performing a method. The method includes receiving a message including a plurality of symbols. The message is written to memory. The writing to memory includes performing for each symbol in the message: writing a data value to a memory location in the memory and reading contents of the memory location after the data value has been written. The data value is determined in response to the symbol and to the contents of any memory locations previously read as part of writing the message to the memory. It is determined if the contents of the memory locations reflect the message. The writing is restarted in response to determining that the contents of the memory locations do not reflect the message.

A further exemplary embodiment is a memory system that includes a memory having a plurality of memory locations and a controller for receiving a message including a plurality of symbols and for writing the message to the memory. The writing the message to memory includes performing for each symbol in the message: writing a data value to a memory location in the memory and reading contents of the memory location after the data value has been written. The data value is determined in response to the symbol and to the contents of any memory locations previously read as part of writing the message to the memory. It is determined if the contents of the memory locations reflect the message. The writing is restarted in response to determining that the contents of the memory locations do not reflect the message.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Exemplary embodiments of the present invention are directed to memories in which a writing action can result in a stored value that does not agree with the desired value, an outcome referred to herein as a "write error". Memory technologies like NAND flash or phase change memory (PCM) suffer this kind of write issue. In these types of memories, further attempts at writing the desired value may be required. Write techniques employing additional writes following an unsuccessful write are generally known as write-and-verify techniques. The act of performing additional writes can consume resources (e.g., bandwidth) of the memory and the system that employs it. Exemplary embodiments described herein utilize writing schemes that are able to reduce or eliminate the number of write attempts beyond the first one, while at the same time, providing a means for dealing with write errors.

As used herein, the term "memory device" refers to an entity that contains memory elements as well as circuitry for accessing them. As used herein, the term "memory array" refers to a collection of memory elements in which a single memory access may be performed at any given time. A memory array has associated circuitry for reading and writing and although physically this circuitry may be regarded as separate from the memory array, such circuitry is included in the concept of memory array herein for the purposes of description. A memory array will generally reside of a memory device, which in turn can have many such memory arrays. As used herein, the term "memory bank" refers to an entity within a memory device that is comprised of one or more memory arrays in which a single memory write or read can be performed. A memory device can have multiple banks, and these can operate independently. One of the inputs to the memory bank is the address to be read or written, and thus the memory bank has an address bus. The arrays within the memory bank receive the same address as the bank, and thus, each of the arrays has an address bus which relays the information from the bank address bus. As such, a reference to the address bus of an array implicitly refers to the address bus of the bank. In turn, the address is communicated to the bank by the memory device, which in turn obtains this input from an externally (to the memory device) specified address in an address bus.

Also as referred to herein, a memory array is comprised of memory cells. Such memory cells are grouped in memory locations; a memory location is defined to be the natural unit (granularity) in which memory is accessed. For example, a typical memory location in Dynamic Random Access Memory (DRAM) is given by the DRAM burst length multiplied times the I/O width of the memory device; this number is 64 bits for a DDR3×8 DRAM memory device. In contemporary memory systems, a memory access is achieved by requesting either a read or a write to a given memory address which can be fulfilled if the bank associated with such request is free. A memory device is defined to have at most one read data bus and at most one write data bus (sometimes these buses will be merged into a single one that may only be used in a given mode at any given time instance). The data communicated through a data bus is directed to/from one bank in the device. In some instances, the act of writing data to a bank is more time consuming than the act of transmitting this data to the device through the data bus. Thus, although at any given time, multiple distinct addresses may be being written into in a multi-bank device, only data for exactly one bank (and hence one address) is being transmitted in the data bus. It is generally the case that a memory device is physically packaged as an integrated circuit or chip.

Exemplary embodiments also include a memory system comprised of a plurality of memory devices in which memory devices that share an address bus may simultaneously receive data that is nonetheless written to different addresses. In an exemplary embodiment, this is accomplished by using a list of addresses kept at each memory device and a control circuit that selects which address from the list is to be used at any given time. An exemplary embodiment is used to implement adaptive write strategies in which what is written to a current memory device may depend on what was written to a previous memory device.

Exemplary embodiments include a general class of methods that are used to overcome write errors with reduced or no rewrites, that are applicable to a memory in which a message is stored via an encoding in a set of memory locations. In an exemplary embodiment, this is accomplished by sequentially writing to memory locations and adapting what is to be written to a next memory location on the basis of the result of the write actions on memory locations earlier in the sequence. This sequence is stopped when the last memory location is written to and then an assessment is made as to whether the written values reflect the intended message. If the written values do not reflect the intended message, then the process is restarted. In an alternate exemplary embodiment, instead of restarting the entire process only a portion of the memory locations are rewritten.

From the perspective of a system that is employing a memory, the latency for a write is generally not nearly as important the latency for a read. One reason for this is that read requests are generally caused by a pending computation process while write requests can be deferred since it is generally the case that no computation process is stalled waiting for them to be completed. It should be noted that there are exceptions to this statement, for example when a write queue is full, a stall may still happen at a computation unit.

An exemplary embodiment includes a method for recovering from write errors in a memory that does not necessarily require rewriting a value that is in error. In exemplary embodiments, a write-and-verify technique is implemented. In other exemplary embodiments, the write-and-verify technique is combined with other methods described herein.

Figure 1:
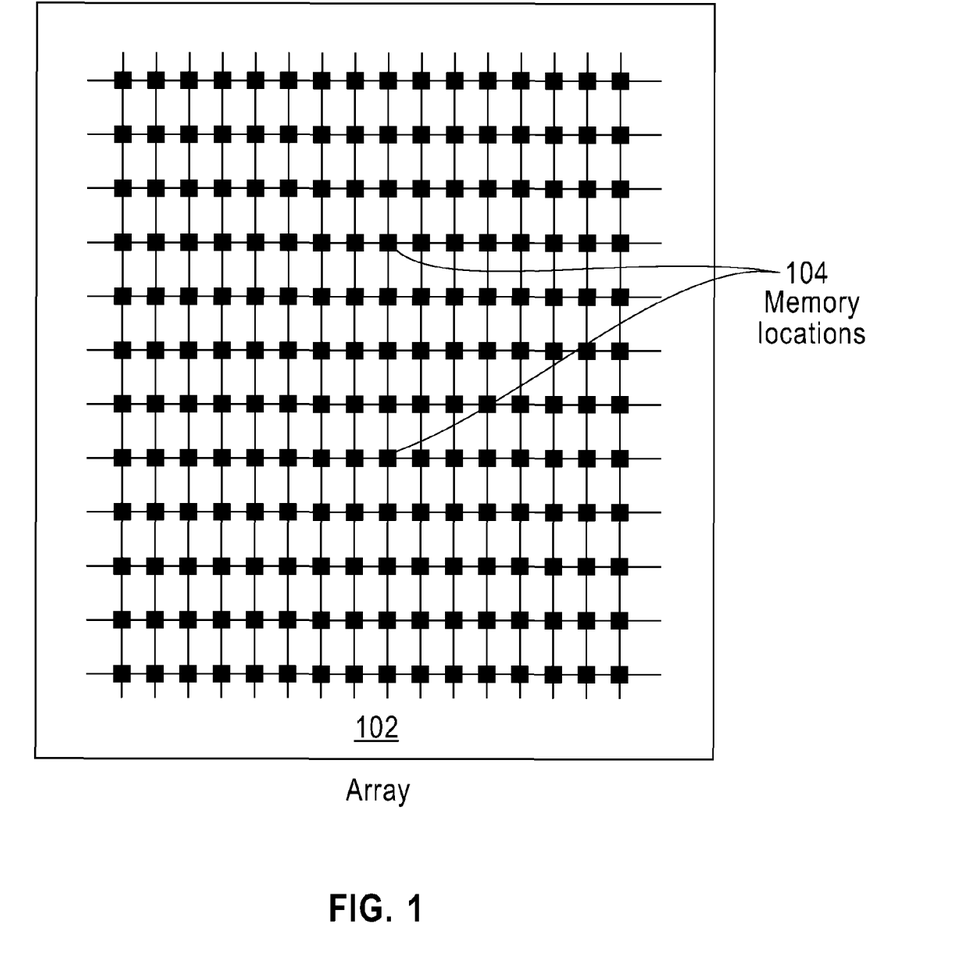
FIG. 1 illustrates a block diagram of physical memory that may be written to by an exemplary embodiment.

Exemplary embodiments may be utilized when a message is encoded in a plurality of memory locations. A memory location can be a single memory cell in a memory technology in which information is stored in arrays of cells (e.g., flash memory and PCM). FIG. 1 illustrates a block diagram of physical memory that may be implemented by an exemplary embodiment. The memory array 102 depicted in FIG. 1 includes several memory locations 104. The term "memory location" may refer to a single memory cell or a group of memory cells that are read and written simultaneously (e.g., sections or entire rows in a memory array). Each of the plurality of memory locations 104 where a message is encoded may reside on distinct arrays, such as array 102, within an integrated circuit (also referred to herein as a "chip") or the message may be spread across arrays on a plurality of distinct integrated circuits. Also, a memory location may refer to a physical location in a medium that is not structured as an array as is the case in rotating media such as compact discs (CDs) and digital video discs (DVDs).

In exemplary embodiments, a linear ordering for the memory locations 104 is assumed. The basic idea is to write to each memory location 104 in sequence, with a read following a write to the memory location 104. In a key aspect of exemplary embodiments, the decision of what to write to a given memory location 104 depends on the outcome of previous writes and reads to other memory locations 104.

It may be appreciated that by writing to memory locations 104 one at a time instead of writing to a group of them in parallel, the total amount of time required to write a message increases. Nonetheless, exemplary embodiments remain useful in practice due to the earlier cited fact that write latency commonly does not represent a significant component of total system performance. A read request can be serviced by obtaining information from all memory locations 104 involved in parallel, even if the processing of the obtained information is done serially.

Figure 2:
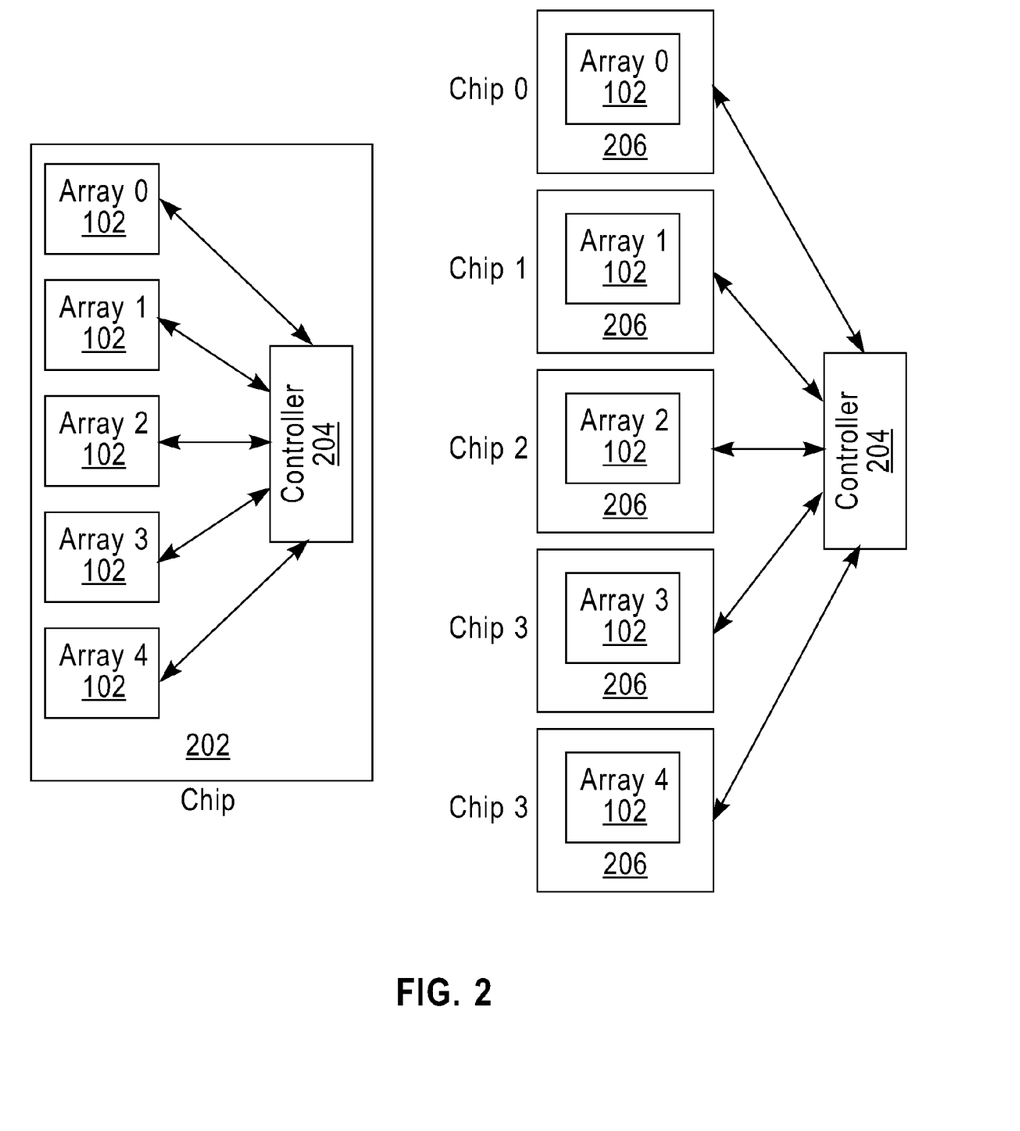
FIG. 2 illustrates systems, based on a single chip solution and a multiple chip solution, that may be implemented by an exemplary embodiment.

FIG. 2 illustrates systems that may be implemented by an exemplary embodiment. The systems depicted in FIG. 2 include a memory comprised of a plurality of memory locations 104 that may be separately accessed for write and read operations. As depicted in FIG. 2, the memory locations are contained in different arrays 102 which can operate independently. The arrays 102 may be located on a single integrated circuit 202 that also includes the memory controller 204. Alternatively, each of the arrays 102 may be located on a separate integrated circuit 206.

The memory controller, such as memory controller 204 or 208, is capable of accepting a write command, a corresponding message to be written in the memory and an address identifying a position where to write the contents associated with the message. The association between memory contents and the message is referred to herein as "an encoding of the message".

Figure 3:
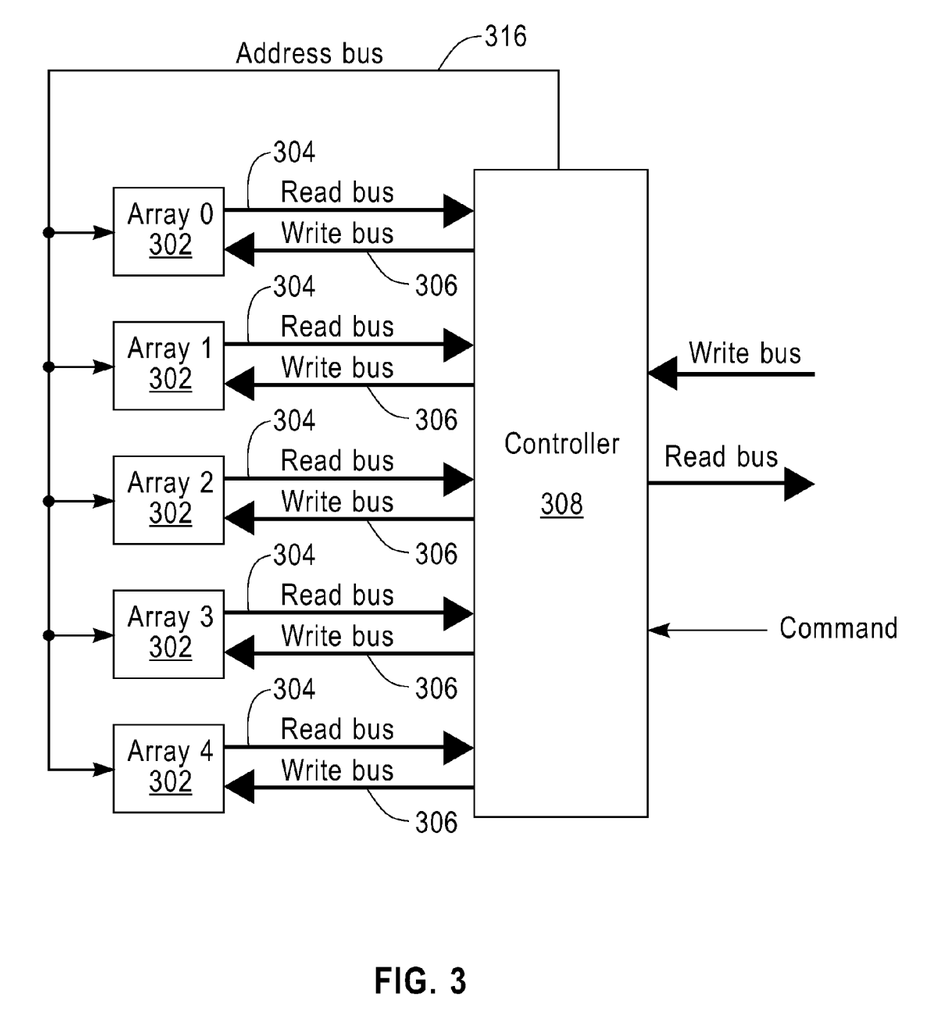
FIG. 3 illustrates a system, including a shared address bus, that may be implemented by an exemplary embodiment.

FIG. 3 illustrates a system having a shared address bus that may be implemented by an exemplary embodiment. As depicted in FIG. 3, each of the arrays 302 has its own data bus (as depicted in FIG. 3 each data bus includes a read bus 304 and a write bus 306) which is used to communicate the contents read from a memory location within the array 302 to the memory controller 308 or to communicate a content to be written to a memory location within an array 302. Data may be communicated from/to the arrays 302 either through separate read and write unidirectional buses (e.g., read bus 304 and write bus 306) as depicted in FIG. 3 or through a single bidirectional data bus. A common address bus 316 connects the memory controller 308 with the arrays 302.

The system depicted in FIG. 3 can be used by either of the systems depicted in FIG. 2. That is, the arrays 302 and the memory controller 308 may be contained in a single integrated processor, or alternatively, one or more of the arrays 302 may be contained within a different integrated processor. When the arrays 102 reside on separate chips 206, the common address bus referred to above is interpreted to be the combination of a common address bus that connects all the chips together with the address bus that the chip employs to communicate address information from the controller 204 to the bank containing the array 102, as well as the address bus that the chip employs to communicate address information from the bank to the array 102.

Figure 4:
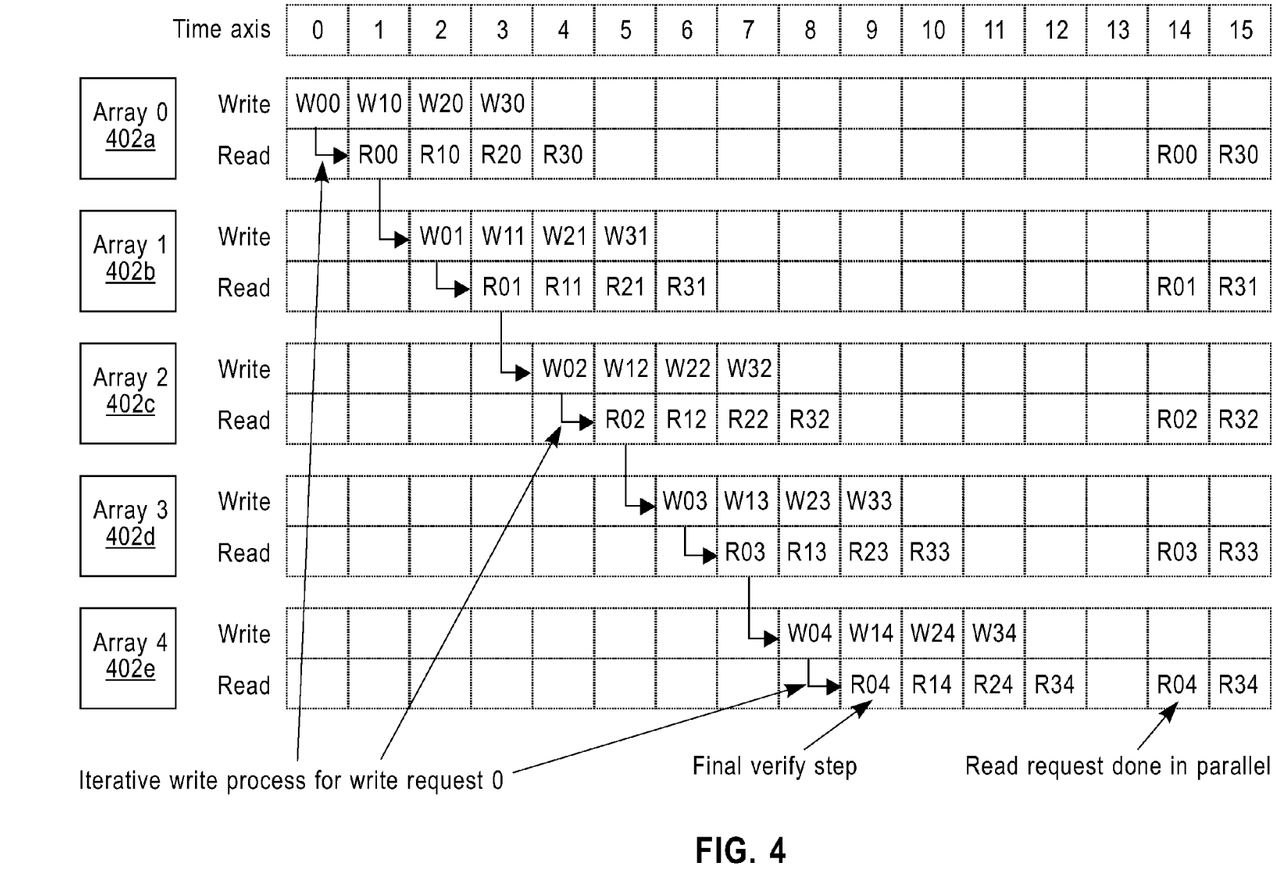
FIG. 4 illustrates a "write sweep" mode process that may be implemented by an exemplary embodiment to write data to memory.

Exemplary embodiments of the system may operate in several different modes. FIG. 4 illustrates a "write sweep" mode that may be implemented by an exemplary embodiment to write data to memory. The write sweep mode depicted in FIG. 4 allows the use of feedback from the result of previous writes, where the time sequence of the write and read operations involving the memory arrays 402 are shown for the case where there are two unidirectional data buses. The memory controller specifies an address and a content to be stored by the corresponding address in Array 0 402a. In the example depicted in FIG. 4, "W00" represents the first symbol (symbol "0") in the first write request (request "0"), and W00 is being written to Array 0 402a. Array 0 402a begins the write operation at the specified address (e.g., specified by an address bus, such as address bus 316). After the write operation is finished, a read operation "R00" is started in the same address. The output of the read operation is sent to the memory controller, which computes the data to be written by the second array, array one 402b. The operation is repeated until the last array, array 4 402e, has written the contents to the first specified address. In this manner, a sequential write is performed, with the value to be written to each array 402 being determined as a function of each previous read and the content to be written.

As depicted in FIG. 4, during the read process, an array 402 might accept another address, and start a new independent write operation (e.g., "W10") at another address. This enables a pipeline structure that allows the system to operate at full write bandwidth, however, the time to complete the writing of a message into all arrays 402 is the sum of the write and read times of all arrays 402.

Figure 5:
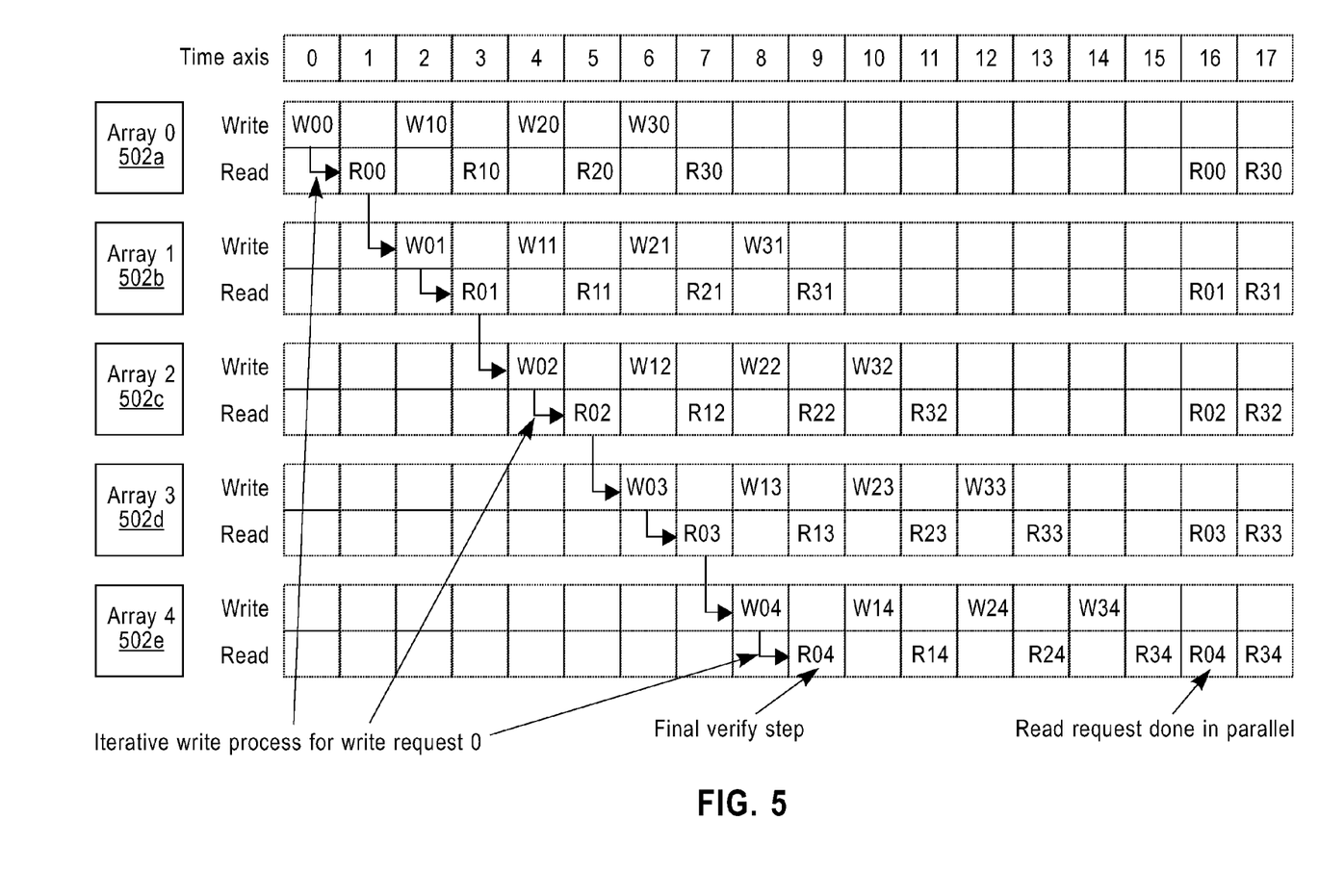
FIG. 5 corresponds to FIG. 4, for an exemplary embodiment that supports a single bidirectional data bus.

FIG. 5 corresponds to FIG. 4, for an exemplary embodiment that supports a single bidirectional data bus that carries both the read data and the write data.

Figure 6:
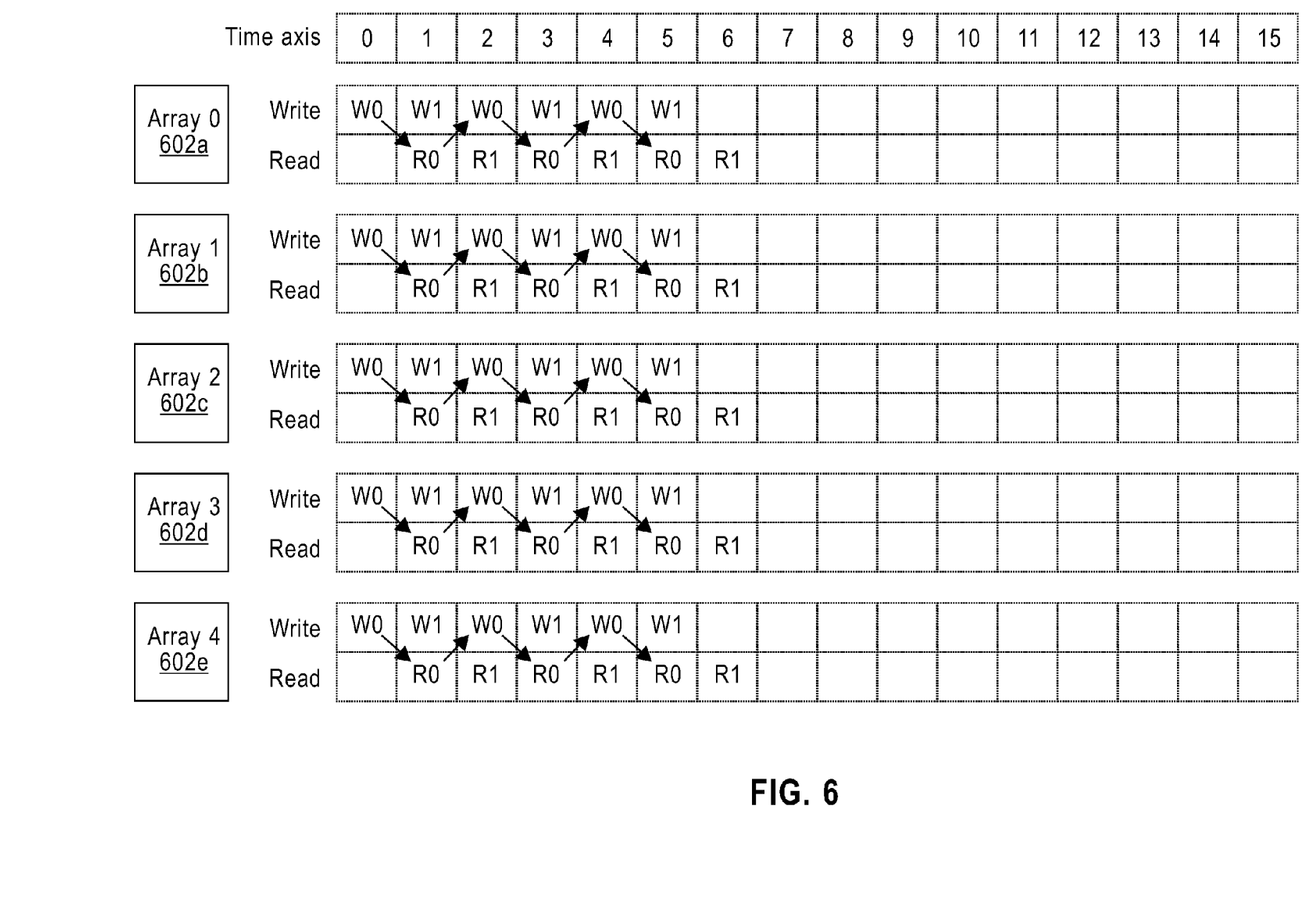
FIG. 6 illustrates a "parallel synchronous" mode that may be implemented by an exemplary embodiment to write data to memory.

FIG. 6 illustrates a "parallel synchronous" or "standard" mode that may be implemented by an exemplary embodiment to write data to memory. As depicted in FIG. 6, every array 602, whenever issued to, writes the datum in the data bus into the address specified at the same time in the address bus. As depicted in FIG. 6, a read operation follows each write operation. In an exemplary embodiment, the result of the read operation is fed to a memory controller, which has the option of issuing a rewrite of the whole message. The parallel synchronous mode depicted in FIG. 6 may be utilized with an address bus that is common to all arrays.

Because the address bus is common to all arrays, in order to operate in "write sweep mode", as depicted in FIGS. 4 and 5, each array or the associated bank or chip containing the array must comprise circuitry that enables the synchronization of the read and write operations.

Figure 7:
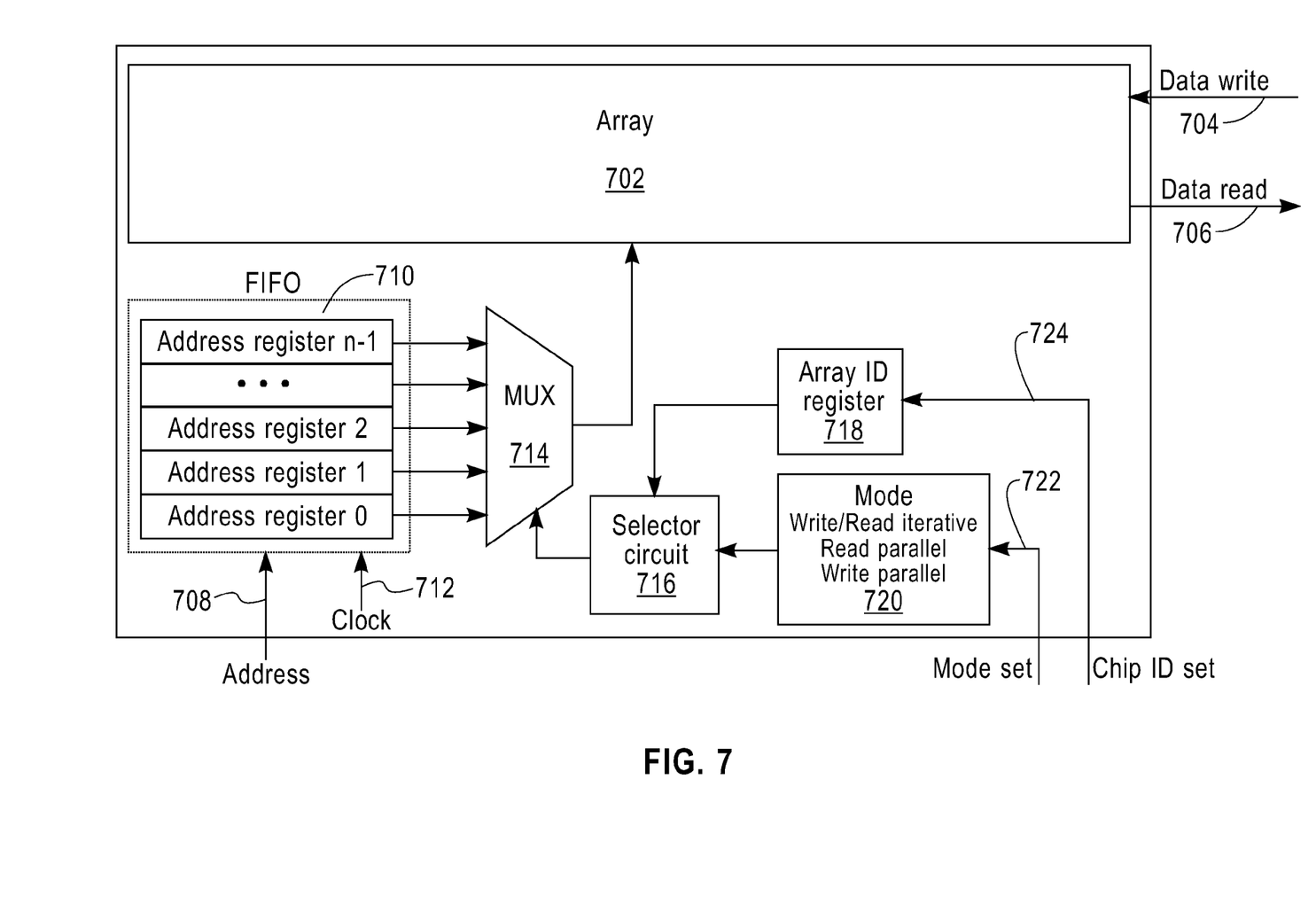
FIG. 7 illustrates circuitry that provides synchronization of read and write operations that may be implemented by an exemplary embodiment.

FIG. 7 illustrates circuitry, local to each array or the associated bank or chip containing the array, meant to provide synchronization of read and write operations that may be implemented by an exemplary embodiment. The circuitry depicted in FIG. 7 allows accesses to the locations of an array to be synchronized with accesses to corresponding locations in other arrays. In an exemplary embodiment, the circuitry (including the array 702) depicted in FIG. 7 is located on a memory device or other integrated circuit. In an alternate exemplary embodiment, the array 702 is located on one integrated circuit and the other circuitry is located on a second integrated circuit that is in communication with the array 702. Though shown as hardware, all or a portion of the elements shown in FIG. 7 may be implemented in software.

Enabling the use of a common address bus 708 and the possibility of having, at the same time, different arrays operating onto different addresses, is an important aspect of a low-cost implementation of the above described method, where the contents of the memory locations to be written in each array 702 are a function of the contents actually written in the memory locations in the previous arrays. To this end, in exemplary embodiments, each array 702 is associated with local control circuitry responsible for providing the proper address at write time. For every message received by the memory controller to be stored, the memory controller specifies the address to the control circuitries of the arrays connected to the common address bus 708 only at the time the first content to be written is specified to the first memory array. Each memory array control circuitry stores the received address 708 in a first-in first-out (FIFO) queue 710, whose shift capability is controlled by a clock signal 712.

In this way the last n addresses (n is the size of the FIFO queue 710) are stored and available for successive usage. In an exemplary embodiment, the address register 0 corresponds to the input address at the current time. In order to access an address in the FIFO queue 710, a multiplexer (MUX) 714 is connected to all the entries of the FIFO queue 710. The input of the MUX 714 allows control of which address is actually specified to the array 702. According to the exemplary method illustrated, for example, in FIG. 5, the first array 502a should use address register 0, the second array 502b should use address register 1, and so on. To this end, each array 702 is associated with an array ID stored in an array ID register 718. In exemplary embodiments, the array ID register 718 is programmed at system boot time through a chip ID set signal 724. In other exemplary embodiments, the array ID register 718 is implemented through a non-volatile memory technology and is programmed at the factory or during system installation or system initialization.

In exemplary embodiments, the array ID corresponds to the set of binary signals, which when used as input to the MUX 714, cause the address register corresponding to the array 702 to be selected. In particular, the array ID is the binary representation of the number associated with the array 702, where the arrays are numbered from the first one to be written to the last one to be written. In exemplary embodiments, a selector circuit 716 allows operation both according to the write method described in this invention, and to directly address the memory locations specified by the current value of the address 708. The particular behavior is controlled by a mode register 720, which specifies whether the selector circuit should output 0 or the contents of the array ID register 718 as input to the MUX 714, and is controlled by an input mode set signal 722. In an exemplary embodiment, valid states for the mode register 720 include a "read parallel" state which specifies that the selector circuit 716 should output 0 to the MUX 714, a "write parallel" state which specifies that the selector circuit 716 should output 0 to the MUX 714, and a "write/read iterative" state which specifies that the selector circuit 716 should output the contents of the array ID register 718 to the MUX 714.

Typical operation of exemplary embodiments as shown in FIG. 7 include a read operation, and a write operation, which can be carried out either in parallel to each array 702 or according to exemplary methods described herein. In exemplary embodiments, a read operation is conducted as follows. The mode register 720 is set to "read parallel" state. An address is specified to all of the arrays and the read is initialized by issuing a command through a control bus (which also includes the mode set signal 722 and the chip ID set signal 724). The memory contents are retrieved through the data read bus 706 and interpreted by having the memory controller apply an error correction decoding algorithm to the data.

In exemplary embodiments, a parallel write operation is conducted as follows. The mode register 729 is set to "write parallel" state. An address is specified to all the arrays and the write is initialized by issuing a command through the control bus. The memory controller specifies the desired memory contents through the data write bus 704, possibly after the application of an error correction encoding algorithm to the information message to be stored in the memory at the specified address. The write proceeds according to the iterative method described in FIG. 6.

In exemplary embodiments, an iterative read/write operation is conducted as follows. The mode register 729 is set to "write/read iterative" state. An address is specified to all the arrays and the write is initialized by issuing a command to the first array through the control bus. After the first write attempt, which could comprise a series of micro write-and-verify steps, the local control circuitry performs a read and issues the outcome through the data read bus 706. The memory controller computes the contents to be stored in the next array at the same address. In the following cycles, the memory controller specifies the computed contents to the second (then third, fourth and so on) array. The procedure continues until all the memory arrays have completed the write operation.

In exemplary embodiments, the memory controller stores the contents actually stored in the memory locations received from the arrays and upon completion of the write process verifies if the actually stored set of contents can be decoded to obtain the originally specified message. If the original message is not obtained, the write process is reinitialized.

The circuitry depicted in FIG. 7 may be utilized by a system that includes two unidirectional data buses (e.g., data write bus 704 and data read bus 706) and by a system that includes a bidirectional data bus (combined data write and read bus).

Figure 8:
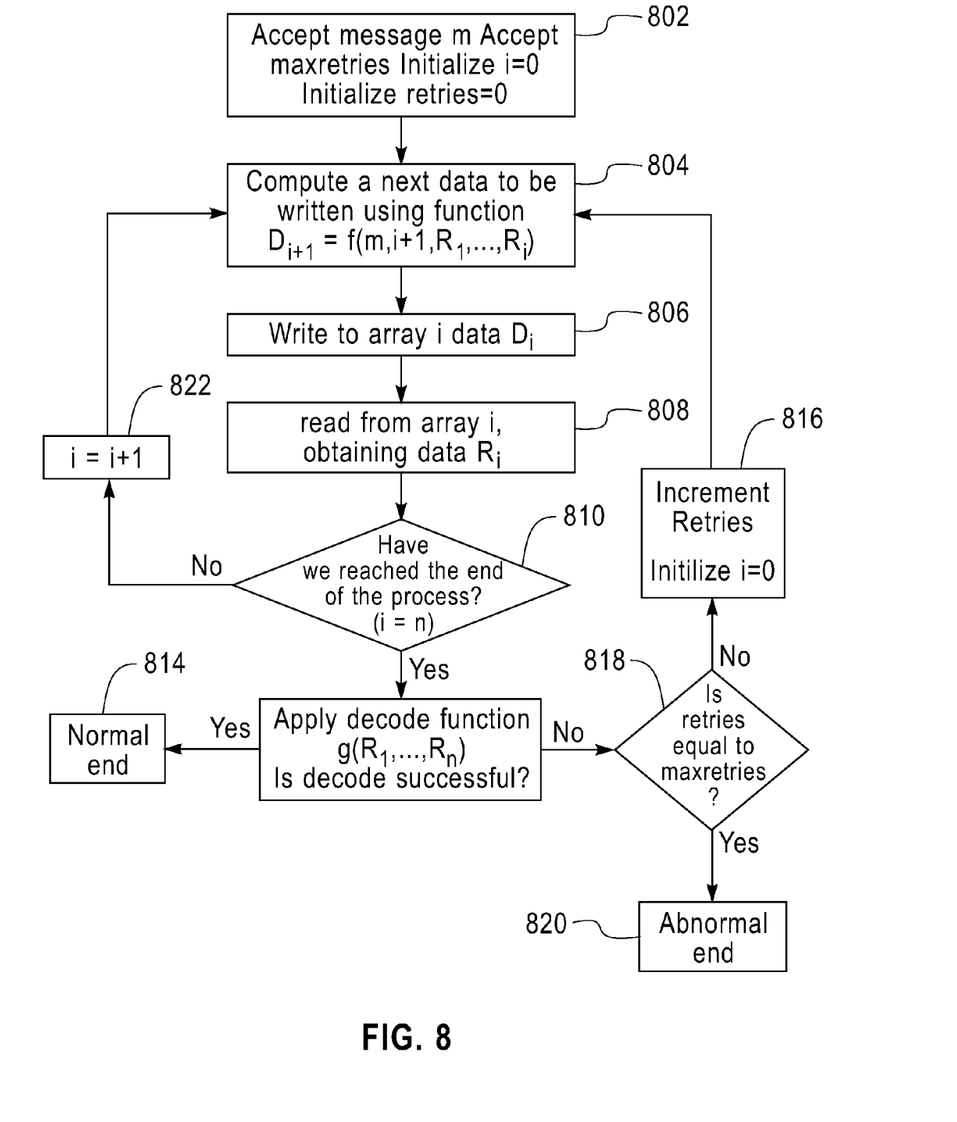
FIG. 8 illustrates a process for writing data that may be implemented by an exemplary embodiment.

FIG. 8 depicts a process for writing data that may be implemented by an exemplary embodiment. In the process depicted in FIG. 8, the data is written in "sweep mode", where an inner cycle is shown to decide the contents to be written by each array at the specified address. At the end of the write operation a check is done by the memory controller to determine whether to end the write operation, issue a complete restart of the write sweep process, or end the write operation declaring an error (issuing an exception). In an exemplary embodiment, the processing depicted in FIG. 8 is driven by a memory controller, in an alternate exemplary embodiment it is driven by a host processor or other memory element (e.g., a memory module).

At block 802, a message, "m" containing "n" symbols to be written is received, along with a maximum number of retries parameter. In addition, an index "i" is initialized to zero and the number of retries is initialized to zero. At block 804, a next data value to be written, "$D_i$", is computed based on the next symbol in the message to be written, "$m_i$", and any previously read data, "$R_1 \ldots R_{i-1}$". If the current symbol in the message is the first symbol in the message, then there isn't any previously read data and the next data value to be written is a function of the current symbol. A variety of encoding functions may be utilized to compute the next data value to be written, such as but not limited to information theory tools for channels with a feedback and described below with reference to FIG. 9. At block 806, data value $D_i$ is written to array i and at block 808, data is read from array i to obtain data $R_i$.

It is determined at block 810, if the writing process has been completed by comparing the index value to the number of symbols in the message. If the index is not equal to the number of symbols in the message, then block 822 is performed and the index is incremented. Processing then continues at block 804 where the next symbol in the message is written.

If it is determined at block 810, that the writing process has completed, then block 812 is performed and a decode function is applied to the read data, $R_1 \ldots Rn$, to determine if the message was written successfully. The decode function utilized is selected based on the encode function utilized when the data is written. If the decode is successful, then block 814 is performed and the write process ends normally. If the decode is not successful, then block 818 is performed to determine if the number of retries is equal to a maximum number of retries. If the number of retries is equal to the maximum number of retries, then block 820 is performed and the write process ends abnormally (e.g., by setting a flag indicating faulty write). If the number of retries is not equal to the maximum number of retries, then block 816 is performed and the number of retries is incremented and the index into the message is initialized to zero. Processing then continues at block 804 where another attempt to write the message is started.

The complete restart of the write sweep process may be done up to a limit established previously as specified by the maximum number of retries parameter. In an exemplary embodiment, this limit may be raised (or lowered) during execution, if, for example, a special priority for the message to be written is conveyed to the memory controller and/or the memory has a low utilization.

Figure 9:
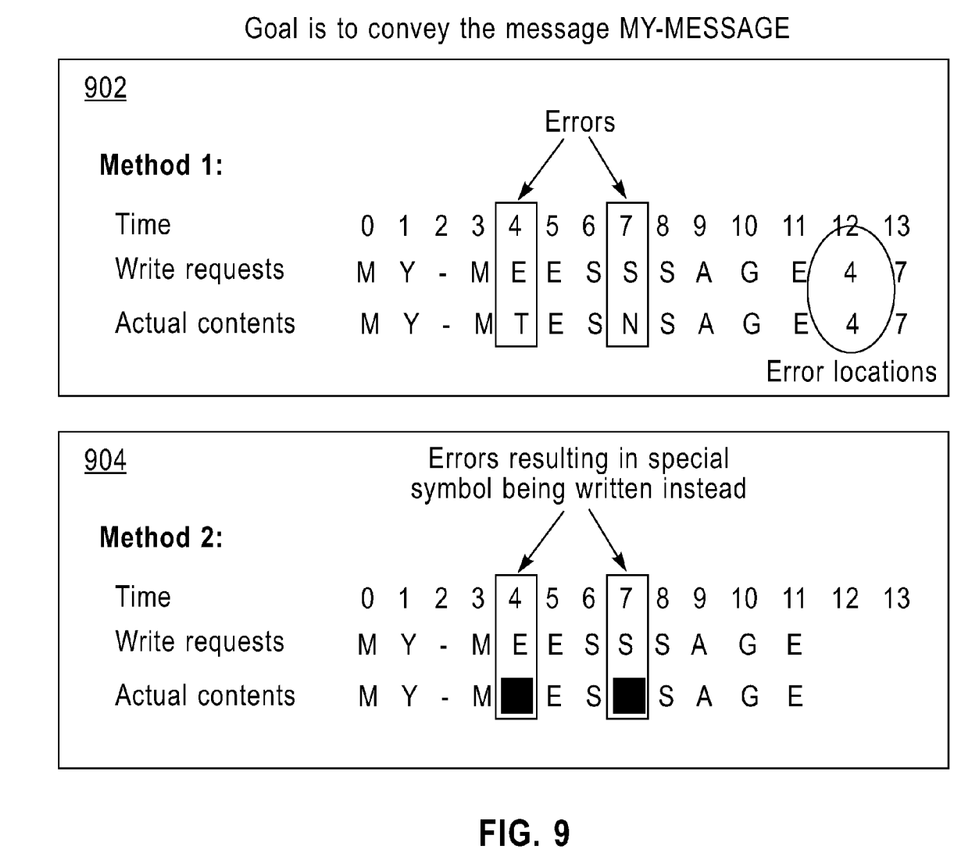
FIG. 9 illustrates two methods for encoding a message that may be implemented by an exemplary embodiment.

In an exemplary embodiment, the encoding function, which decides the contents to be written into an array based on the outcomes of previous data written is obtained using information theory tools for channels with feedback. FIG. 9 depicts two methods for encoding a message, "Method 1" 902 and "Method 2" 904 that may be implemented by exemplary embodiments.

For Method One 902, it is assumed that the number of distinct memory locations, or symbols in the message, "n", is equal to the number of distinct memory locations available for writing minus twice the number of write errors that can be sustained by the writing of the message. In the example depicted in FIG. 9, the message contains ten symbols, the write process can sustain two errors, and the number of distinct memory locations available for writing is equal to fourteen. The processing associated with Method One 902 may be performed by block 804 of FIG. 8, with a few additional steps at the end of the processing of the message to account for the error recovery processing in Method One 902. As described previously with respect to FIG. 8, a message to be stored ("MY-MESSAGE") is received. In addition, the index into the symbols in the message, an index into the arrays where the message is to be stored, and an error counter are initialized to zero, and an error list is initialized to null.

Next, the ith symbol in the message is written to the jth array, and the results are read. If this write is in error, then the error_counter is incremented, the value j is added to the error_list, j is incremented, and processing continues by writing the ith symbol to the next array (j+1), and reading the results to determine if the write is in error. In this manner, an attempt is made to write the symbol to the next array, or memory location and the faulty memory array location is skipped.

If the ith symbol in the message is not in error, then both i and j are incremented and processing continues by writing the next symbol to the next array, and reading the results to determine if the write is in error. Processing continues in this manner until the error_counter exceeds the number of errors that can be corrected or until the entire message has been written.

When the error counter exceeds the number of errors that can be corrected, the entire process of writing the message starts again, up to a maximum number of retries. If the maximum number of retries is reached, then the process is aborted.

Referring to Method One 902 in FIG. 9, the first four symbols, "MY-M" are written without error, and the fifth symbol "E" is written as a "T" to the array four and is in error. In response to detecting the error, the error location (the array four) is recorded in the error_list, the error_counter is incremented, and the symbol "E" is written to array six, where is it written without error. As shown in Method One 902 of FIG. 9, the second "S" in my message is also written in error to array seven and then written without error to array eight. Because the write process in this example can handle up to two errors, the error_counter does not exceed the number of errors that can be corrected. The location of the errors is recorded in the error_list.

Once all of the symbols have been written, the indices in error_list are written using error_counter locations following the last location written to. These writes also have an intervening read. Any of the M last memory locations, or arrays, that are unused are written to with a default value. If any of the indices are written in error, then the entire process starting from step one is repeated up to max_retries times. As shown in Method One 902 in FIG. 9, array twelve contains the value four and array thirteen contains the value seven, which indicates that memory locations, or arrays, four and seven include data values that are in error. If the maximum number of retries is reached, then the process is aborted.

An exemplary process of decoding data encoded using Method One 902 is as follows: the error_list and error_counter are retrieved from the last M memory locations; all symbols with indices in the error list are ignored; and concatenating the remaining symbols results in the message.

In Method One 902 it is assumed that an index can be written in a memory location (i.e., that the magnitude of this index "fits" in a memory location).

In an alternate exemplary embodiment, such as Method Two 904 in FIG. 9, the index value is not recorded in the memory location. A benefit to this approach is that fewer memory locations are required to perform that error recovery. As shown in Method Two 904, the number of extra memory locations required for error recovery is the same as the number of errors that are recoverable (in this example two). In contrast to Method One 902, extra locations are not required for each error to record the error location. Consider the case where the write operation in each location in each array comprises an iterative writing scheme, where the contents are repeatedly adjusted or rewritten until a stop condition is met. If the stop condition is met but the contents of the memory location do not reflect the desired contents with the prefixed accuracy, as, for example, in the case where the stop condition is verified because a maximum number of write iterations have been performed it is possible to write a special content to the memory location. If the special content is clearly distinguishable from standard contents, it can be used for marking an "erasure", i.e., a symbol that denotes a failed write. Method Two 904 shows a special symbol being written to locations four and seven to indicate that they contain data that is in error. When the data is decoded, the presence of the special symbol indicates that the read should skip to the next memory location and should ignore the contents of the current memory location when decoding the message.

In an exemplary embodiment, the data encoded in the memory through the use of the techniques described herein could itself be encoded with an error control code before being subject to the methods described above. This allows for the recovery of errors that take place after the write process is finished. In exemplary embodiments, instead of writing a special symbol on a memory location which did not converge to the proper value, the special symbol is written in the following location, thus reducing the time required to complete the writing task. At the decoding, a special symbol behaves as a "delete" character. In other words, the data is read serially, and upon reception of a special symbol, the index steps back by one symbol and erases it.

An example of another operation is a high priority read or write request to the memory. Some of these priorities could be associated with memory refresh activity (the act of reading and writing data again when it is expected that the memory will not retain data over time) or with priorities informed to the memory controller through an external signal.

In an exemplary embodiment, the definition of a write in the description above can be generalized to include write-and-verify techniques that by themselves are comprised of writes with intervening reads not shown in the diagrams such as the one in FIG. 2. This allows for combining existing write-and-verify techniques with an exemplary embodiment to provide further design tradeoff options.

Figure 10:
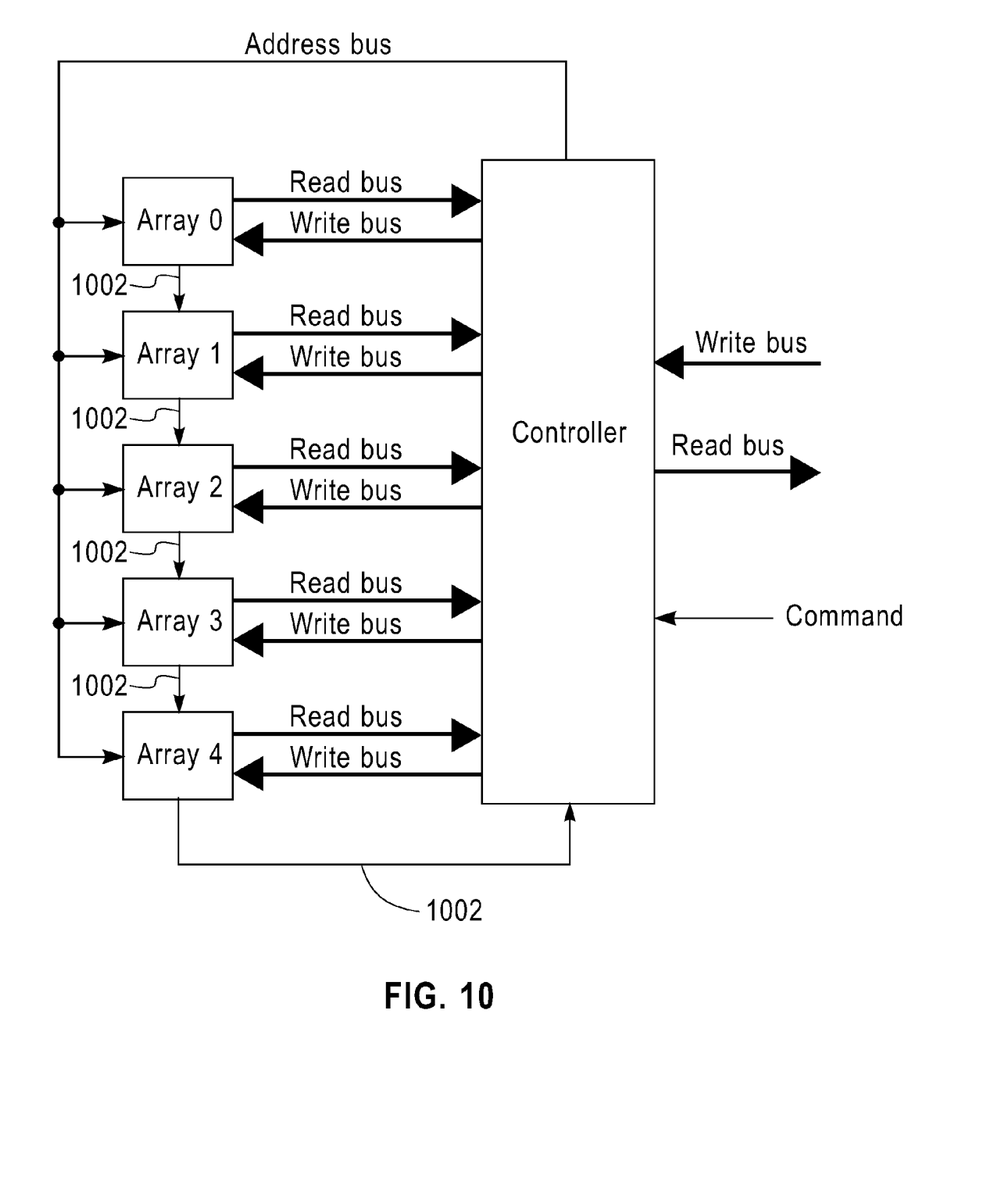
FIG. 10 illustrates a system, including a shared address bus and a bus connecting each array in the system that may be implemented by an exemplary embodiment.

FIG. 10 illustrates a system, including a shared address bus and a bus connecting each array in the system that may be implemented by an exemplary embodiment. FIG. 10 is similar to FIG. 3 but also includes a bus 1002 connecting each array in the sequence. This bus 1002 can be used to convey information from one array to another about the status of the write sweep process without involving the memory controller. The last device in the chain may report on a status back to the memory controller, as shown in FIG. 10.

In exemplary embodiment an array adapts a writing strategy as a function of the information obtained from the previous arrays. For example, the information conveyed could be the number of memory locations that could not be programmed to the desired contents and the writing strategy can be modified as follows. An iterative writing strategy is adopted. If the number of memory locations that could not be programmed to the desired contents is lower than a given threshold $N_{np}$ then the number of allowed iterations is $N_{i1}$. If it is larger then the number of allowed iterations is increased to $N_{i2} > N_{i1}$.

Technical effects and benefits include the ability to implement a write-and-verify technique that reduces or eliminates the number of write attempts while still providing a way of dealing with write errors. This may lead to a decrease in the amount of memory resources required to perform an iterative write technique. Other technical effects and benefits include the ability to share an address line between memory arrays when the same address in the connected memory arrays are not accessing the same address simultaneously. This leads to a decrease in the number of address buses required in a memory system.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer implemented method for writing to memory, the method comprising:
   receiving at a computer a message including a plurality of symbols;
   writing the message to a memory, the writing comprising for each symbol in the message writing a data value to a memory location in the memory and reading contents of the memory location after the data value has been written, the data value determined in response to the symbol and to the contents of any memory locations previously read as part of writing the message to the memory;
   determining at the computer if the contents of the memory locations reflect the message; and
   restarting at the computer the writing in response to determining that the contents of the memory locations do not reflect the message.

2. The method of claim 1, wherein the number of restarts is limited based on a restart parameter.

3. The method of claim 2, wherein the restart parameter is set in response to one or more of a priority for the message and a current utilization of the memory.

4. The method of claim 1, wherein the writing further comprises for each symbol comparing the data value to the contents read from the memory location and rewriting the data value to a next memory location in response to the data value not being equal to the contents read.

5. The method of claim 1, wherein the writing further comprises for each symbol comparing the data value to the contents read from the memory location and writing a special value to the memory location in response to the data value not being equal to the contents read.

6. The method of claim 1, wherein input to determining if the contents of the memory locations reflect the message includes reading the contents of the memory locations simultaneously.

7. The method of claim 1, wherein at least one of the data values includes redundant information to aid in error location detection and correction.

8. The method of claim 1, wherein the writing further comprises for each symbol comparing the data value to the contents read from the memory location and writing a special symbol to a next memory location in response to the data value not being equal to the contents read.

9. The method of claim 1, wherein the writing is paused in order to execute a refresh schedule.

10. A computer program product for writing to memory, the computer program product comprising:
    a tangible storage medium readable by a processing circuit and storing instructions for execution by the processing circuit for performing a method comprising:
    receiving a message including a plurality of symbols;
    writing the message to a memory, the writing comprising for each symbol in the message writing a data value to a memory location in the memory and reading contents of the memory location after the data value has been written, the data value determined in response to the symbol and to the contents of any memory locations previously read as part of writing the message to the memory;
    determining if the contents of the memory locations reflect the message; and
    restarting the writing in response to determining that the contents of the memory locations do not reflect the message.

11. The computer program product of claim 10, wherein the number of restarts is limited based on a restart parameter.

12. The computer program product of claim 10, wherein the writing further comprises for each symbol comparing the data value to the contents read from the memory location and rewriting the data value to a next memory location in response to the data value not being equal to the contents read.

13. The computer program product of claim 10, wherein the writing further comprises for each symbol comparing the data value to the contents read from the memory location and writing a special value to the memory location in response to the data value not being equal to the contents read.

14. The computer program product of claim 10, wherein at least one of the data values includes redundant information to aid in error location detection and correction.

15. The computer program product of claim 10, wherein the writing further comprises for each symbol comparing the data value to the contents read from the memory location and writing a special symbol to a next memory location in response to the data value not being equal to the contents read.

16. A memory system comprising:
    a memory including a plurality of memory locations; and
    a controller for receiving a message including a plurality of symbols and for writing the message to the memory, the writing the message to the memory comprising:
    for each symbol in the message writing a data value to a memory location in the memory and reading contents of the memory location after the data value has been written, the data value determined in response to the symbol and to the contents of any memory locations previously read as part of writing the message to the memory;
    determining if the contents of the memory locations reflect the message; and restarting the writing in response to determining that the contents of the memory locations do not reflect the message.

17. The system of claim 16, wherein the number of restarts is limited based on a restart parameter.

18. The system of claim 16, wherein the writing the message to the memory further comprises for each symbol comparing the data value to the contents read from the memory location and rewriting the data value to a next memory location in response to the data value not being equal to the contents read.

19. The system of claim 16, wherein the writing the message to the memory further comprises for each symbol comparing the data value to the contents read from the memory location and writing a special value to the memory location in response to the data value not being equal to the contents read.

20. The system of claim 16, wherein input to determining if the contents of the memory locations reflect the message includes reading the contents of the memory locations simultaneously.

* * * * *